(12) United States Patent
Baselmans et al.

(10) Patent No.: US 7,330,239 B2
(45) Date of Patent: Feb. 12, 2008

(54) LITHOGRAPHIC APPARATUS AND DEVICE MANUFACTURING METHOD UTILIZING A BLAZING PORTION OF A CONTRAST DEVICE

(75) Inventors: Johannes Jacobus Matheus Baselmans, Oirschot (NL); Huibert Visser, Zevenhuizen (NL); Henri Johannes Petrus Vink, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 349 days.

(21) Appl. No.: 11/101,627

(22) Filed: Apr. 8, 2005

(65) Prior Publication Data

US 2006/0227069 A1    Oct. 12, 2006

(51) Int. Cl.
 *G03B 27/32* (2006.01)
 *G03B 27/54* (2006.01)
(52) U.S. Cl. .......................................... 355/67; 355/77
(58) Field of Classification Search .................. 355/53, 355/67, 77
 See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,639,722 B2 | 10/2003 | Amm et al. | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,829,092 B2 | 12/2004 | Amm et al. | |

(Continued)

FOREIGN PATENT DOCUMENTS

WO    WO 98/33096    7/1998

(Continued)

OTHER PUBLICATIONS

U.S. Appl. No. 10/919,530, filed Aug. 17, 2004, Baselmans et al.

*Primary Examiner*—Rodney Fuller
(74) *Attorney, Agent, or Firm*—Sterne, Kessler, Goldstein & Fox P.L.L.C.

(57) ABSTRACT

A system and method utilize a lithographic apparatus comprising an illumination system, an array of individually controllable elements, and a projection system. The illumination system conditions a radiation beam. The array of individually controllable elements modulates the beam. At least one group of elements in the array of individually controllable elements being tilted to at least a same tilt direction with a same tilt sign. For example, the tilting can form one or more blazing portions (e.g., blazing super-pixel portions) in the array of individually controllable elements. The projection system projects the modulated beam onto a target portion of a substrate. The projection system includes an aperture that filters out undesired diffraction orders of the modulated beam.

22 Claims, 18 Drawing Sheets

U.S. PATENT DOCUMENTS

2002/0079432 A1  6/2002  Lee et al.
2004/0041104 A1  3/2004  Liebregts et al.
2004/0130561 A1  7/2004  Jain
2005/0007572 A1  1/2005  George et al.
2006/0038969 A1  2/2006  Baselmans et al.

FOREIGN PATENT DOCUMENTS

WO  WO 98/38597  9/1998

LITHOGRAPHIC APPARATUS AND DEVICE MANUFACTURING METHOD UTILIZING A BLAZING PORTION OF A CONTRAST DEVICE

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), micro-electro-mechanical-systems (MEMS), and other devices involving fine structures. In a conventional apparatus, a patterning device can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. An advantage of such a system compared to a mask-based system is that the pattern can be changed more quickly and for less cost.

In general, a flat panel display substrate is rectangular in shape. Known lithographic apparatus designed to expose a substrate of this type typically provide an exposure region, which covers a full width of the rectangular substrate, or which covers a portion of the width (e.g., about half of the width). The substrate is scanned underneath the exposure region, while the mask or reticle is synchronously scanned through the projection beam. In this way, the pattern is transferred to the substrate. If the exposure region covers the full width of the substrate, then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

Within maskless lithography, it is desirable to image with high contrast and high efficiency.

Therefore, what is needed is a system and method that increase light intensity efficiency and contrast.

SUMMARY

One embodiment of the present invention provides a lithographic apparatus comprising an illumination system, an array of individually controllable elements, and a projection system. The illumination system conditions a radiation beam. The array of individually controllable elements modulates the beam. At least one group of elements in the array of individually controllable elements is tilted to at least a same tilt direction with a same tilt sign. For example, the tilting can form one or more blazing portions in the array of individually controllable elements. The projection system projects the modulated beam onto a target portion of an object. The projection system includes an aperture that filters out undesired diffraction orders of the modulated beam.

Another embodiment of the present invention provides a method comprising the following steps. Tilting at least one group of elements in the array of individually controllable elements to at least a same tilt direction with a same tilt sign. For example, the tilting can form one or more blazing portions in the array of individually controllable elements. Modulating a beam of radiation using the array of individually controllable elements. Projecting the modulated beam onto a target portion of an object. Filtering out undesired diffraction orders of the modulated beam before they reach the object.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

DETAILED DESCRIPTION

Figure 1A:
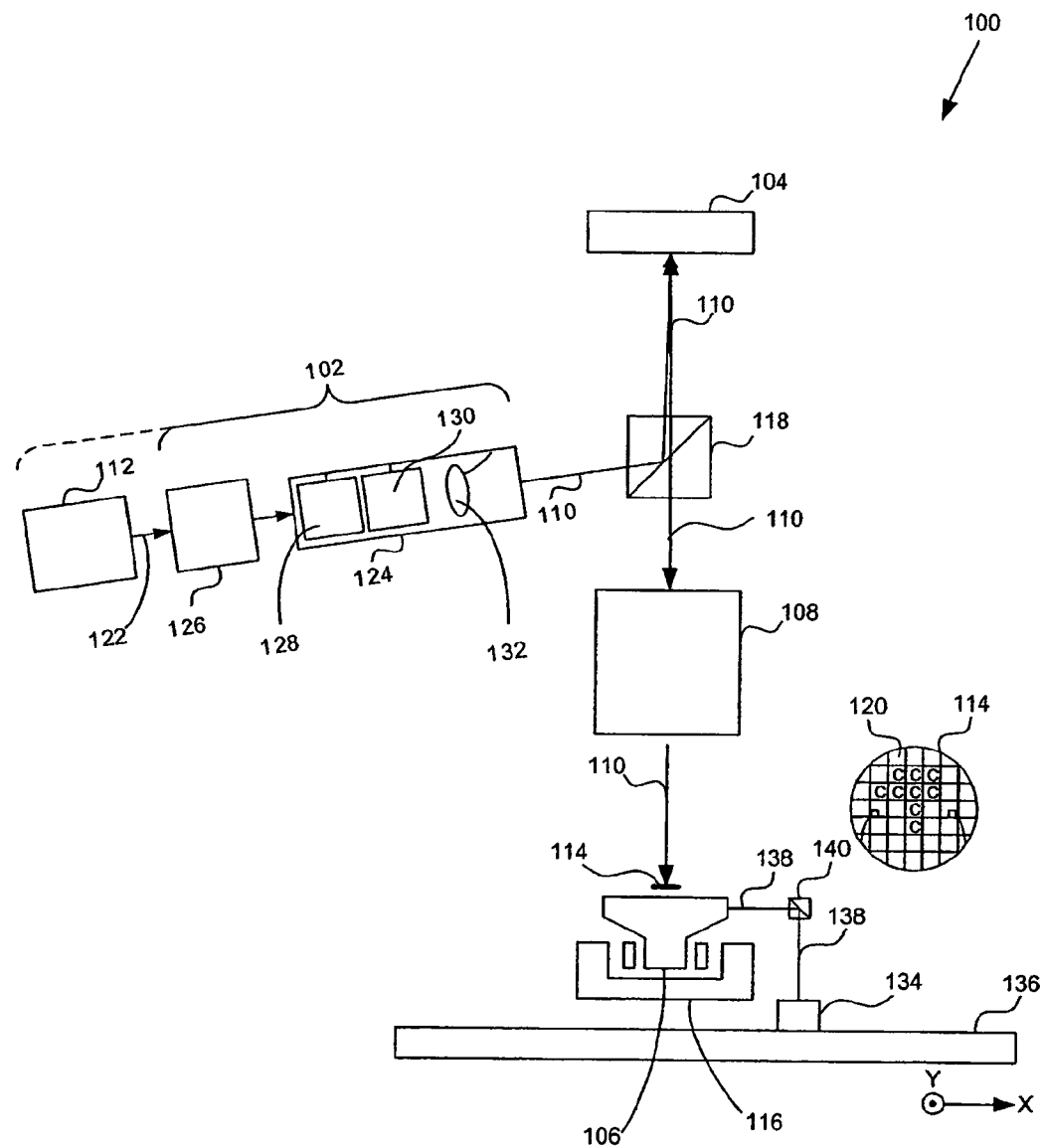
FIGS. 1A and 1B depict lithographic apparatus, according to various embodiments of the invention.

In one embodiment, the present invention provides a blazing portion in a section of an array of individually controllable elements (e.g., a contrast device). For example, a section can be a 5×5 array of elements, or any other sized group of elements. All the elements in the blazing portion have their individually controllable elements positioned at a same angle, which forms the blazing portion. In one example, this can be accomplished through use of a super-pixel. For example, a super-pixel is a group of individually controllable elements that form a single spot (e.g., by optically associating the group of individually controllable elements with a single element in a microlens array (MLA). The blazing portion may be used to increase light intensity in a first diffraction order beam modulated by the array. This may be accomplished by substantially eliminating a negative first diffraction order modulated beam, such that the positive first diffraction order modulated beam has, in effect, about equal to or more than twice the intensity compared to a typical positive first diffraction order modulated beam. For example, when using a $\lambda/4$ tip deflection, substantially all of the incident light is reflected in the first diffraction order.

In another embodiment, instead of a first diffraction order, a higher diffraction order can be used by higher tip deflection. For instance, all the light may be concentrated in the second diffraction order for $\lambda/2$ tip deflection. It is to be appreciated that all the light is concentrated in the n-th diffraction order upon n times $\lambda/4$ tip deflection.

In another embodiment, perpendicular projection is accomplished by directing light onto the array at a diffraction order of interest (which is used within the projection part), where the light may also impinge on a blazing portion of the array, such that the projected light leaves the contrast device perpendicular.

Thus, in one example, through use of a blazing portion it is possible to concentrate substantially all of the diffracted energy in the order of interest (e.g., a diffraction order) towards a substrate.

In another embodiment, "partial coherent imaging" mode can be used, during which the array of individually controllable elements is imaged at the substrate, however no super-pixels are used.

Overview and Terminology

The use of "object," "substrate," "work piece," or the like are interchangeable in this application, and can be, but are not limited to, a work piece, a substrate (e.g., a flat panel display glass or plastic substrate), a wafer (e.g., a semiconductor wafer for integrated circuit manufacture), a print head, micro or nano-fluidic devices, a display panel in a projection display system, or the like.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiment of several of these devices are discussed in some more detail below.

A programmable mirror array may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate.

An array of diffractive optical MEMS devices may also be used in a corresponding manner. A diffractive optical MEMS device is comprised of a plurality of reflective ribbons that may be deformed relative to one another to form a grating that reflects incident light as diffracted light.

A further alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors.

The required matrix addressing may be performed using suitable electronic means. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entirety.

A programmable LCD array is another example, an example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a microlens array (known as an MLA) or a Fresnel lens array, e.g. to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g. water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

Figure 1B:
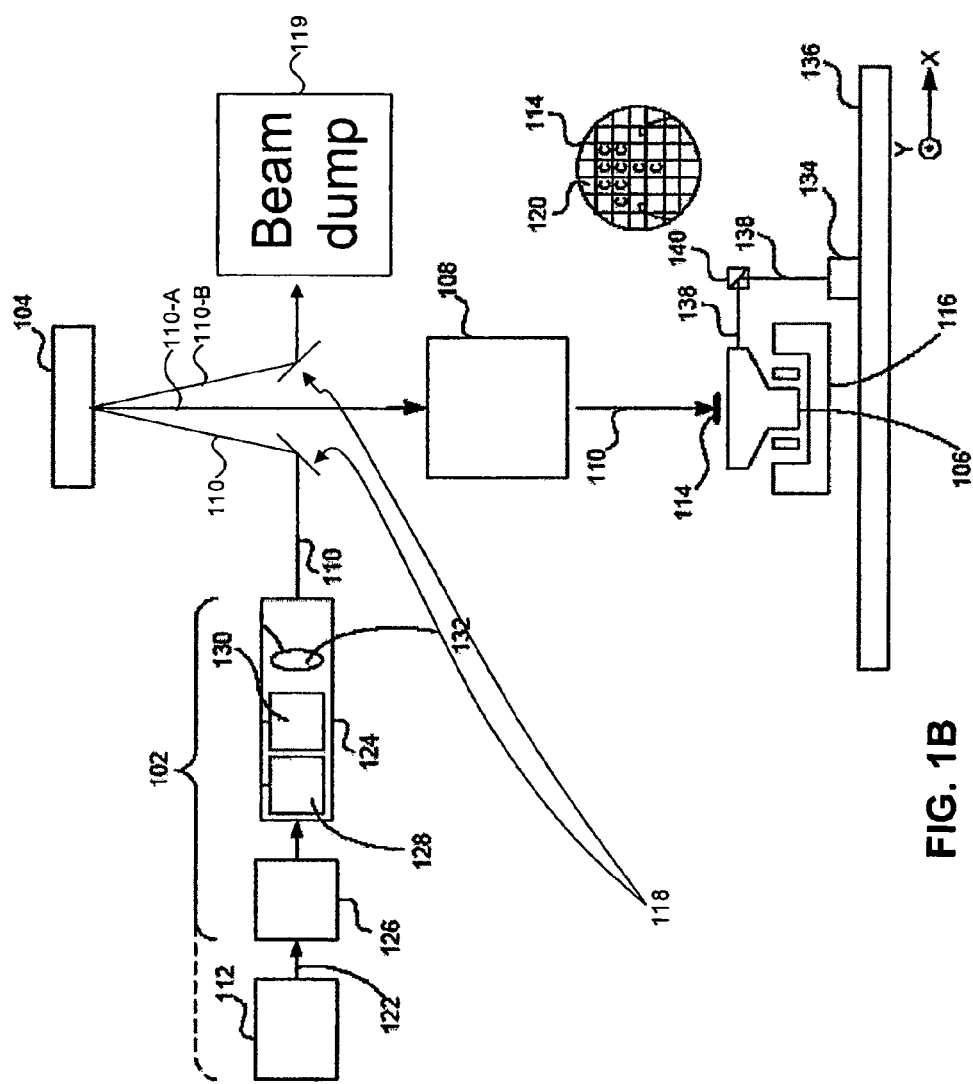

FIGS. 1A and 1B schematically depict a lithographic projection apparatus 100, according to various embodiments of the present invention. Apparatus 100 includes at least a radiation system 102, an array of individually controllable elements 104 (e.g. a contrast device), an object table 106 (e.g., a substrate table), and a projection system ("lens") 108.

Radiation system 102 can be used for supplying a beam 110 of radiation (e.g., UV radiation, 356 nm, 248 nm, 193 nm, 157 nm, 128 nm, EUV radiation, e.g., 10-13 nm, etc.), and may comprise a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate or plastic substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials or a mirror system) can be used for projecting the patterned beam received from a directing device 118. For example, the directing device is a beam splitter 118 in FIG. 1A and a pair of folding mirrors 118 in FIG. 1B.

In the embodiment shown in FIG. 1B, which is discussed in more detail below, beam 110 impinges on array 104 such that modulated light 110-A in a desired diffraction order is directed towards projection system 108, while modulated light 110-B in undesired diffraction orders are scattered from array 104 and directed by directing device 118 onto a beam dump 119.

Light is directed from directing device 118 onto a target portion 120 (e.g., one or more dies) of substrate 114. Projection system 108 can project an image of the array of individually controllable elements 104 onto substrate 114.

The illumination 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as a conditioning device 126 (e.g., a beam expander). In this example, element 130 could be an integrator 130 and element 132 could be a condenser 132. In this way, beam 110 impinging on the array of individually controllable elements 104 has a desired uniformity and intensity distribution in its cross section.

It should be noted, with regard to FIGS. 1A and 1B, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using directing device 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), object table 106 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIGS. 1A and 1B. A similar system can also be used to position the array of individually controllable elements 104. It will be appreciated that beam 110 can alternatively/additionally be movable, while object table 106 and/or the array of individually controllable elements 104 can have a fixed position to provide the required relative movement.

In an alternative configuration of the embodiment, substrate table 106 can be fixed, with substrate 114 being movable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes, for example:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

In these first four exemplary modes, "partial coherent imaging" is typically performed for integrated circuit formation. Using this imaging, each element in an array of individually controllable elements has a unique tilt. The array is positioned at the object plane and the substrate is positioned at the image plane of the imaging projection optics. Various illumination modes can be applied: annular, conventional, quadrupole, dipole, etc. Also, different configurations for each element in an array of individually controllable elements can be used to increase the "negative black" values: phase step mirrors, applying larger tilts, shaping the mirrors (butterfly, H-shape), or the like.

Combinations and/or variations on the above described modes of use or entirely different modes of use can also be employed.

Figure 2A:
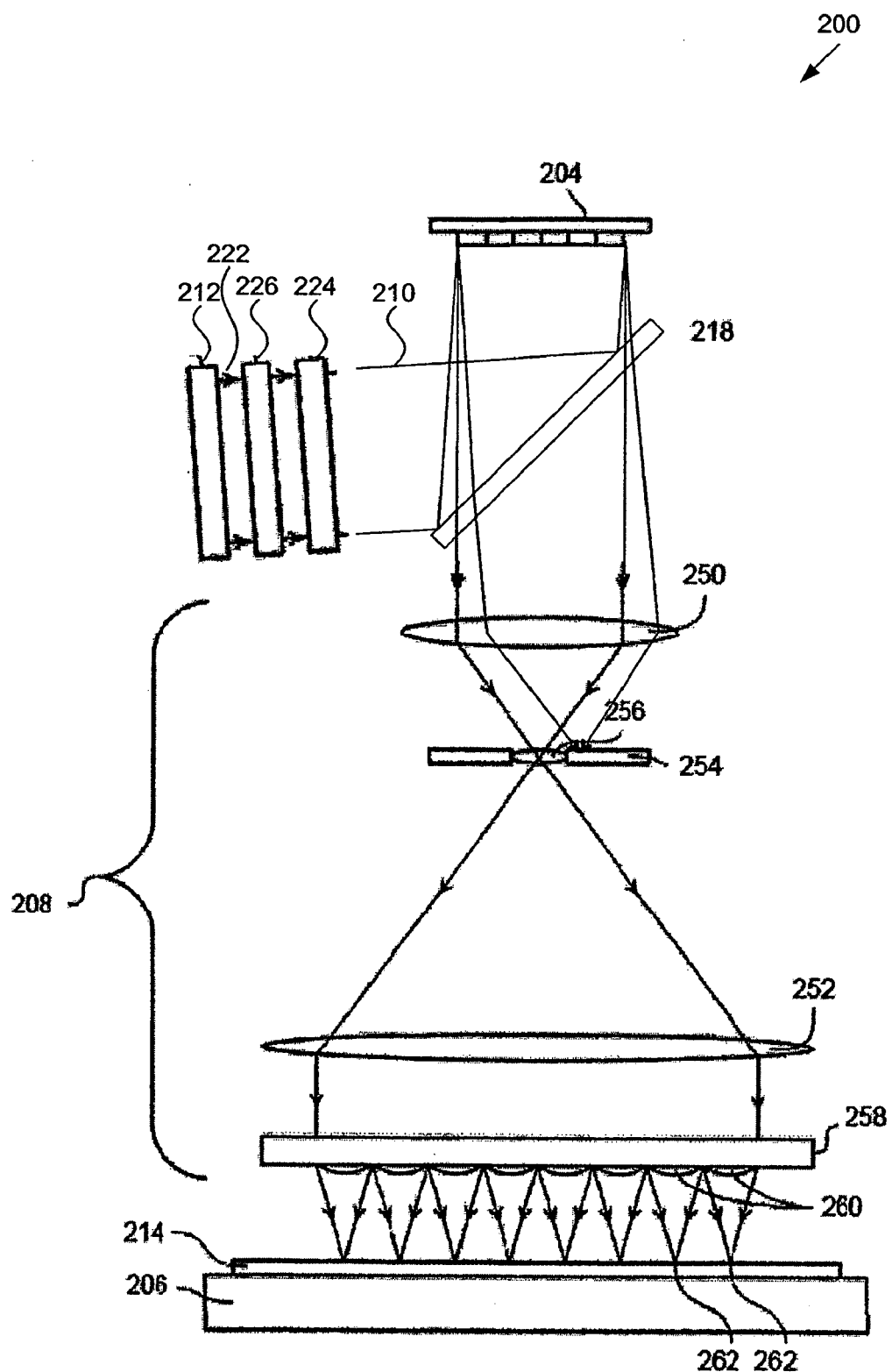
FIGS. 2A and 2B depict lithographic apparatus that can be used, for example, in the manufacture of a flat panel display, according to various embodiments of the present invention.
Figure 2B:
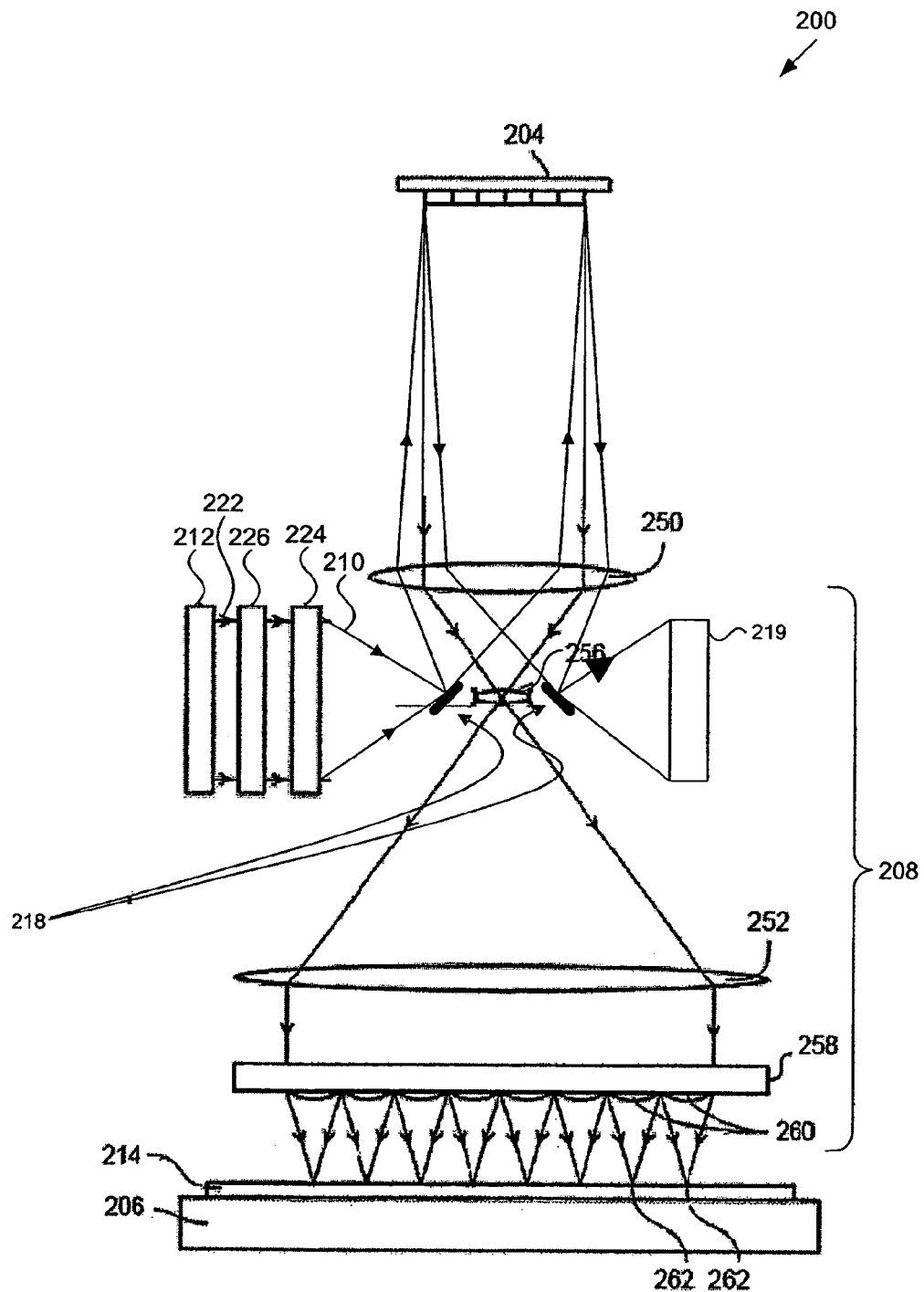

FIGS. 2A and 2B depict a lithographic apparatus 200, according to various embodiments of the present invention. For example, apparatus 200 can be especially useful in the manufacture of flat panel displays using a pixel grid imaging mode, discussed below.

A difference between FIGS. 2A and 2B is the use of a beam splitter as a directing device 218 in FIG. 2A, as compared to using a pair of folding mirrors as a directing device 218 in FIG. 2B. Also, in FIG. 2B modulated light in a desired diffraction order is directed onto projection system 208, while modulated light in undesired diffraction orders are scattered by array 204 and directed onto a beam dump 219.

Projection system 208 can project images of secondary sources for which the elements of the array of individually controllable elements 204 act as shutters.

In an imaging grid array embodiment, projection system 208 can also comprise a microlens array (MLA) to form the secondary sources and to project microspots onto substrate 214.

Source 212 (e.g., a frequency tripled Nd:YAG laser in pixel grid imaging mode or an excimer laser in other modes) can produce a beam of radiation 222. Beam 222 is fed into an illumination system (e.g., illuminator) 224, either directly or after having traversed conditioning device 226, such as a beam expander, for example.

In one example, when apparatus 200 is operating in a pixel grid imaging mode, discussed below, illuminator 224 can comprise an adjusting device for setting a zoom to adjust a spot size of beam 222. In addition, illuminator 224 will generally include various other components, such as a spot generator and a condenser. For example, a spot generator can be, but is not limited to, a refractive or diffractive grating, segmented mirrors arrays, waveguides, or the like. In this way, beam 210 impinging on the array of individually controllable elements 204 has a desired zoom, spot size, uniformity, and intensity distribution in its cross section.

As shown in FIGS. 2A and 2B, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 210 then diverges and is focused by second lens 252 (e.g., a field lens).

Projection system 208 further comprises an array of lenses 258 (e.g., a microlens array (MLA)) arranged to receive expanded modulated radiation 210. Different portions of the modulated radiation beam 210, corresponding to one or more of the individually controllable elements in the array of individually controllable elements 204, pass through respective lenses 260 in MLA 258. Each lens 260 focuses the respective portion of the modulated radiation beam 210 to a point which lies on a substrate 214. In this way, an array of radiation spots 262 are exposed onto substrate 214. Although only eight lenses 260 are shown, MLA 258 can comprise many thousands of lenses, which is also true of a number of individually controllable elements in the array of individually controllable elements 204 used as patterning device.

The system in FIGS. 2A and 2B allow for another mode of operation, Pixel Grid Imaging Mode. In this mode the pattern formed on substrate 214 is realized by subsequent exposure of spots formed by a spot generator (not shown) that are directed onto array 204. The exposed spots have substantially the same shape. On substrate 214 the spots are printed in substantially a grid. In one example, the spot size is larger than a pitch of a printed pixel grid, but much smaller than the exposure spot grid. By varying intensity of the spots printed, a pattern is realized. In between the exposure flashes, the intensity distribution over the spots is varied.

In one example, using this mode, which may be used for formation of flat panel displays, individually controllable elements can be grouped into super-pixels. One super-pixel modulates the light of one spot at the substrate. The super-pixel is imaged at the entrance of an MLA in the exit pupil of each spot printed. The spot shape can be influenced by the illuminator through use of a spot defining element (e.g., spot generators), zoom of blazing functions, or the like.

Figure 3:
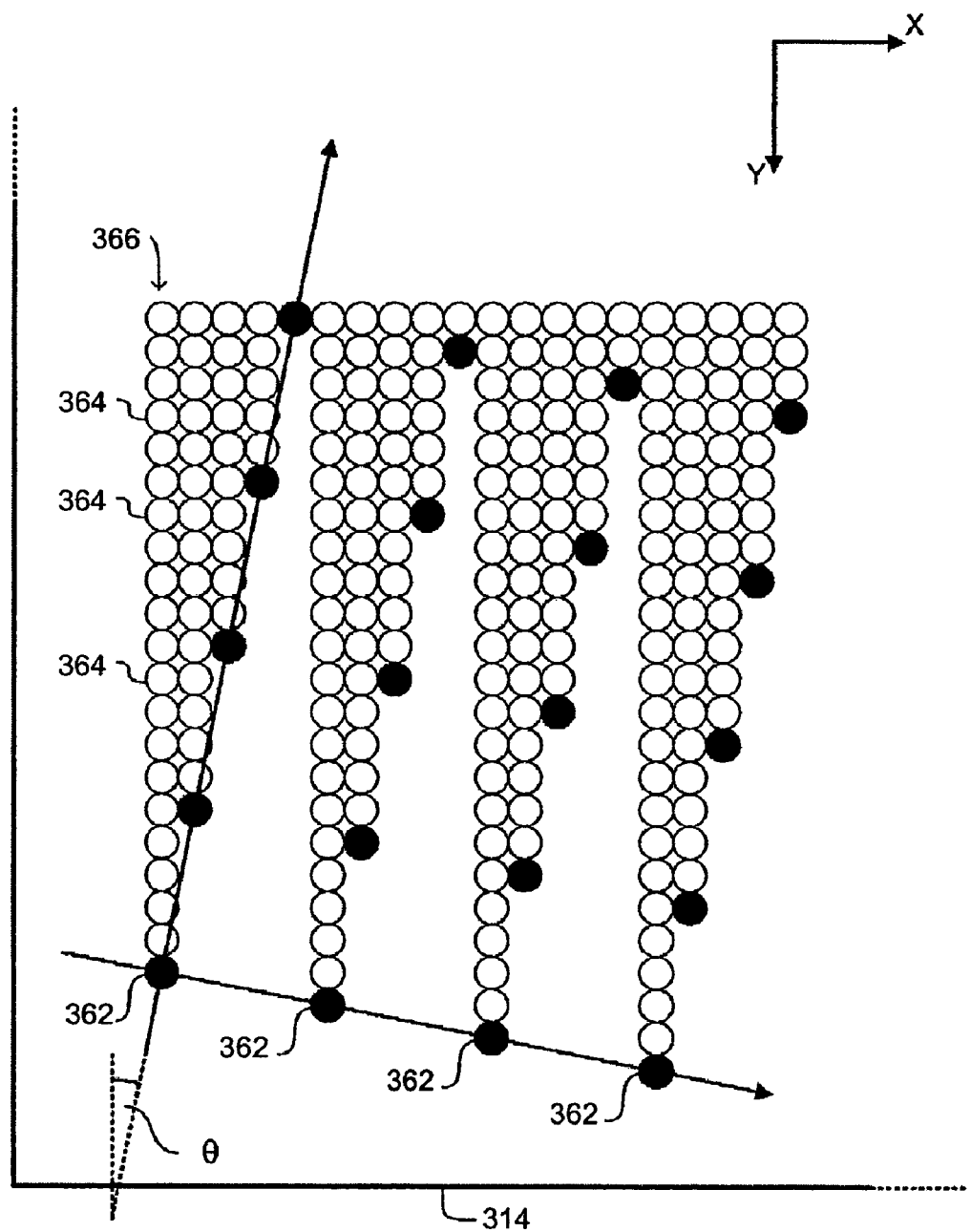
FIG. 3 depicts a mode of transferring a pattern to a substrate using a lithographic apparatus, according to one embodiment of the present invention.

FIG. 3 illustrates schematically how a pattern on a substrate 314 is generated, according to one embodiment of the present invention. For example, this embodiment can be performed using the pixel grid imaging mode discussed above.

The darkened circles 362 represent spots recently projected onto substrate 314 by a MLA in a projection system, for example the projection system as shown in FIG. 2. Substrate 314 is moved relative to the projection system in a Y direction as a series of exposures are exposed on substrate 314.

The open circles 364 represent spots that have previously been exposed on substrate 314. As shown, each spot 362 projected onto substrate 314 using the array of lenses within the projection system exposes a row 366 of spot exposures 362/364 on substrate 314. The complete pattern for substrate 314 is generated by the sum of all the rows 366 of spot exposures 364 exposed by each of the spots 362. Such an arrangement is commonly referred to as "pixel grid imaging," which was discussed above.

It can be seen that the array of radiation spots 362 is arranged at an angle θ relative to substrate 314 (i.e., when the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3. Also, it will be appreciated that in practice the spots may partially overlap.

It is to be appreciated that although 5×5 spots are shown in between two neighboring spots of the MLA, the actual number may be lower or higher. In one embodiment, up to about 100×100 spots are used.

In one example, a spot grid at a substrate is about half a minimum linewidth to be printed (e.g., from about 0.1 microns up to a few microns), while a spot pitch at a MLA is about 100 micrometers up to about a few hundred micrometers.

Figure 4:
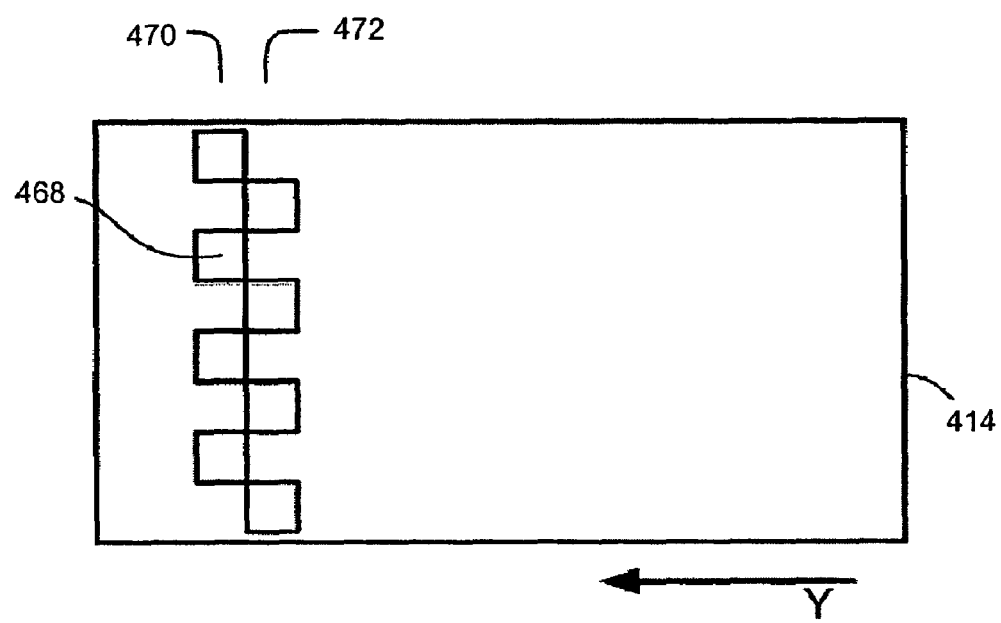
FIG. 4 depicts an arrangement of optical engines for exposing a pattern on a substrate, for example, used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470,472 in a "chess board" configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines can be used.

In one example, each optical engine can comprise a separate illumination system, patterning device, and/or projection system, as described above. It is to be appreciated, however, that two or more optical engines can share at least a part of one or more of the illumination system, patterning device, and projection system.

FIGS. 5A and 5B show a top and side view (looking into line A-A), respectively, of a section 500 of an array of individually controllable elements (e.g., element 104 in FIG. 1), according to one embodiment of the present invention. In this example, section 500 includes a 5×5 array of individual controllable elements 502. In other embodiments, section 500 may include, e.g., at least a 2×2 array of individually controllable elements (e.g. mirror elements), for instance at least a 4×4 array, at least a 5×10 array, at least a 10×10 array, or at least a 20×20 array of individually controllable elements. In one example, elements 502 can individually tilt at a positive angle to a same value, while in other examples elements 502 will tilt together, which latter configuration is sometimes referred to as a super-pixel, which is discussed above. For example, when two or more adjacent individually controllable elements (e.g., 502-Cn or Dn (n being an integer greater than or equal to 1)) that move around a same axis (e.g., axes 506 or 512, respectively) are combined with a common driving connection (not shown), the combined elements form what may be referred to as a super-pixel. An exemplary discussion of a super-pixel is found in U.S. Ser. No. 10/919,530, filed Aug. 17, 2004, which is incorporated by reference herein in its entirety. It is to be appreciated that other sized super-pixels can also be used. For example, an array of elements 502 as small as 2×2 pixels can be used in order to form a "grating" or a "diffraction grating," which causes impinging light to diffract into multiple diffraction orders.

As best seen in FIG. 5B, a first row 504 of five elements 502-C1 to 502-C5 is actuated around an axis 506, to form a super-pixel having a configuration 508. A second row 510 of five elements 502-D1 to 502-D5 is actuated around an axis 512, to form a super-pixel having a configuration 514. In this embodiment, elements 502-Cn in row 504 are actuated in an opposite direction relative to elements 502-Dn in row 510. This actuation scheme causes elements 502-Cn and 502-Dn in rows 504 and 510, respectively, to form a diffraction grating on section 500.

Figure 5:
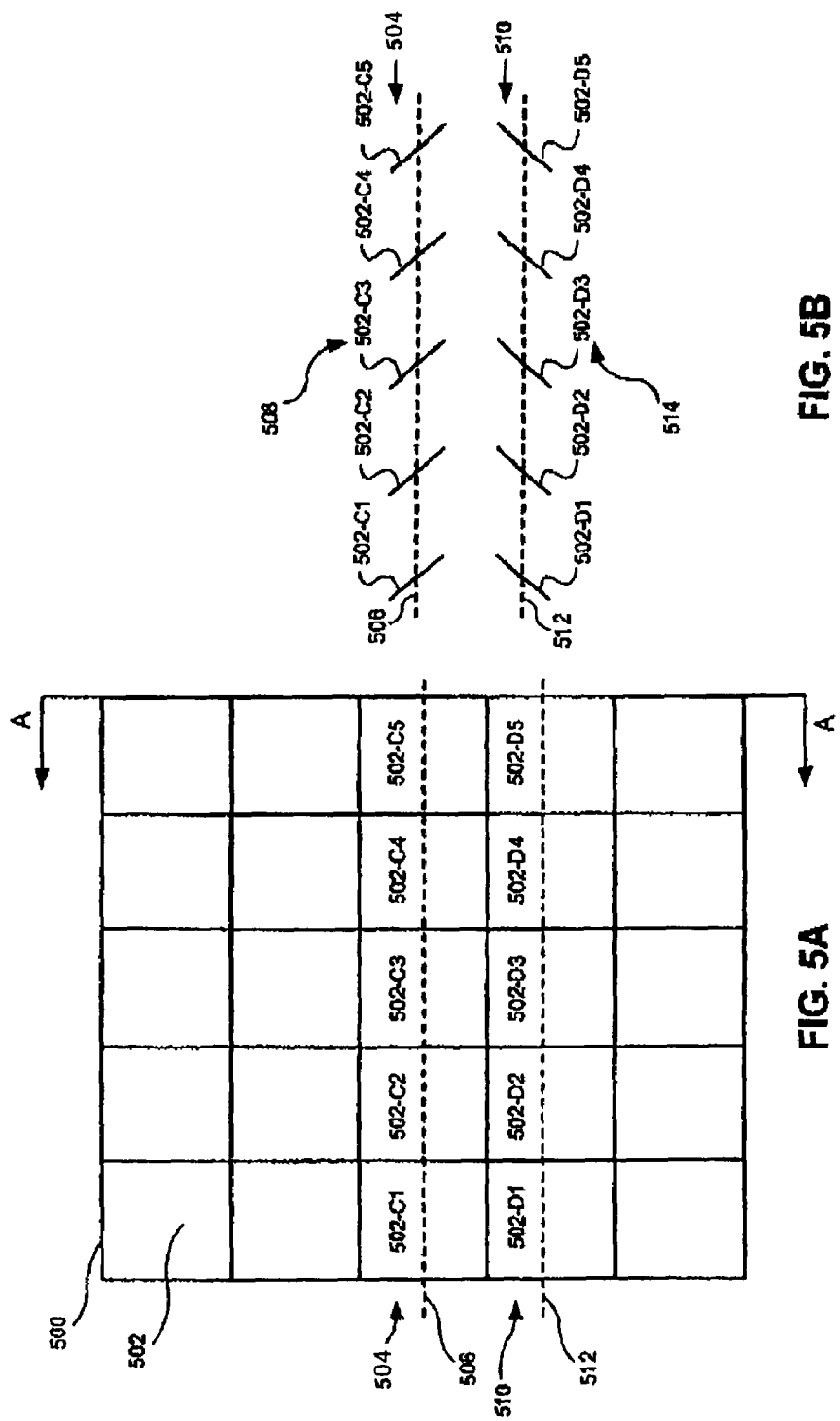
FIGS. 5A and 5B show a top and side view (looking into line A-A), respectively, of a section of an array of individually controllable elements, according to one embodiment of the present invention.
Figure 6:
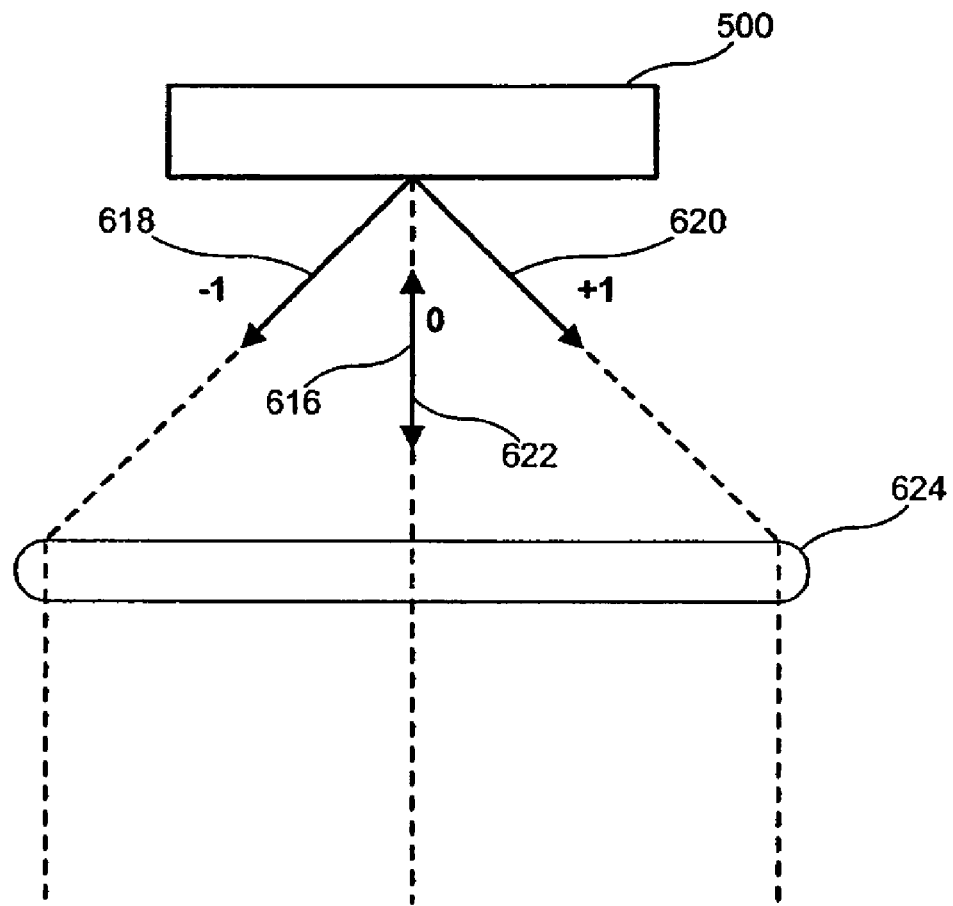
FIG. 6 shows light paths of illuminating and modulated light, according to one embodiment of the present invention.

FIG. 6 shows light paths of an illuminating beam 616 and modulated beams 618, 620, and 622, according to one embodiment of the present invention. Illuminating beam 616 is directed onto section 500 using an optical device 624 (e.g., a lens), for example, after being reflected using a beam splitter (e.g., beam splitter 118 or 218, as shown in FIGS. 1 and 2, respectively). When rows 504 and 510 of section 500 are configured as shown in FIG. 5, rows 504 and 510 form the diffraction grating, which causes impinging light 616 to diffract into at least positive first diffraction order modulated beam 620, negative first diffraction order modulated beam 618, and zero diffraction order modulated beam 622. (Other higher diffraction orders are also present, but not shown.) In one example, with λ/4 tip deflection, substantially no zero diffraction order modulated beam 622 is formed. The diffraction angle (θ) is defined by a grating constant:

$$\mathrm{Sin}(\theta) = k\lambda/p$$

Where θ equals a diffraction angle, k is the diffraction order, λ is a wavelength of illumination beam 616, and p is a period of the grating, for example, a width and/or length of element 502. In one example, undesired diffraction orders can be filtered within a projection system (not shown), while desired order reaches a substrate (not shown). However, undiffracted light (e.g., specularly reflected light) can also reach the substrate, which can cause errors.

In one example, there is a higher contrast in a diffraction order as compared to a zero diffraction order. This is because specular reflections are generated from parts of section 500 that are not tilted (e.g., hinges, posts, slits, etc.), which become part of a zero diffraction order. However, using a first diffraction order can reduce overall intensity by more than a factor of two. This is because there are positive and negative portions of the first diffraction order and higher diffraction orders, which reduces intensity efficiency.

In one example, all elements 502-Cn in row 504 have a same tilt axis 506 and tilt angle, while all elements 502-Dn in neighboring row 510 have a same tilt axis 512 and a same tilt angle (which is opposite to the tilt angle of row 504) when a same voltage or control signal is separately applied to rows 504 and 510. Through having the opposite angles for all elements in adjacent rows, an even diffraction order distribution is formed in modulated light that has impinged on section 500, such that a mean intensity is transmitted through the middle of lens 624.

FIGS. 7A and 7B show a top and side view (looking into line B-B), respectively, of a section 700 of an array of individually controllable elements, according to one embodiment of the present invention. In this example, section 700 includes a 5×5 array of individual controllable elements 702. In one example, elements 702 can individually tilt at a positive angle to a same value, while in other examples elements 702 will tilt together, which latter configuration is sometimes referred to as a super-pixel which is discussed above.

As best seen in FIG. 7B, a first row 704 has five elements 702-Cn that are actuated around an axis 706 to form a super-pixel having the configuration 708. A second row 710 has five elements 702-Dn that are actuated around an axis 712 to form a super-pixel having configuration 714. In this embodiment, which compared to the embodiment shown in FIGS. 5 and 6, elements 702-Cn in row 704 are actuated in a same direction as elements 702-Dn in row 710. Through actuation in a same direction, rows 704 and 710 form a blazing portion of section 700 of the array. Through use of a blazing portion, it is possible to concentrate substantially all of the diffracted energy in the order of interest (e.g., a positive first diffraction order) towards a substrate (not shown), which increases light intensity efficiency compared to the embodiment shown in FIGS. 5 and 6.

In one example, when all elements 702 in a row are tilted in a same tilt direction and a same tilt sign there can be a merged single mirror 702 a length of the row instead of individual elements 702-n.

Figure 8:
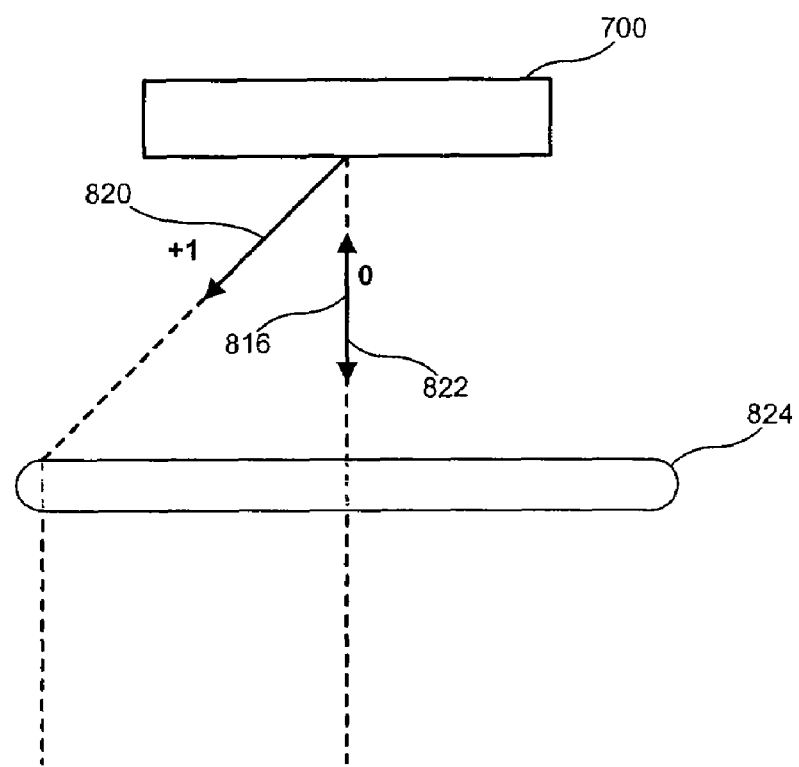
FIGS. 8 and 9 show light paths of illuminating and modulated light, according to various embodiments of the present invention.
Figure 9:
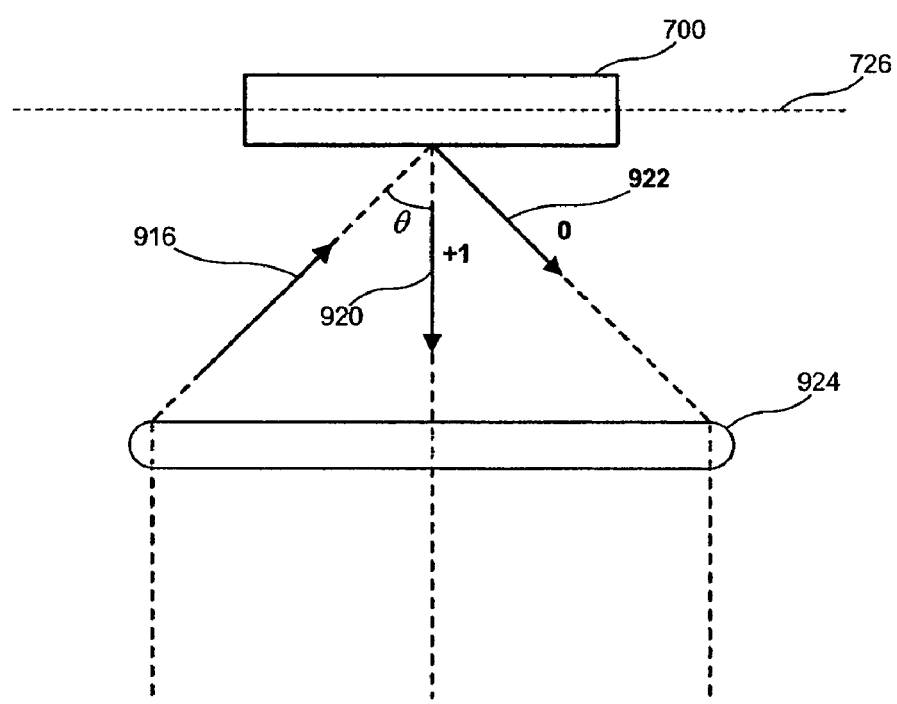

FIGS. 8 and 9 show light paths of an illuminating beam 816/916 and modulated beams 820/822 and 920/922, respectively, according to various embodiments of the present invention.

With reference to FIG. 8, illuminating beam 816 is directed onto section 700 using an optical device 824 (e.g., a lens, usually after being reflected using a beam splitter, as shown in FIGS. 1 and 2). In one example, when rows 704 and 710 of section 700 are configured as shown, elements 702 in rows 704 and 710 form the blazing portion, as discussed above, which causes impinging light 816 to diffract into only positive first diffraction order modulated beam 820 and zero diffraction order modulated beam 822.

Figure 13:
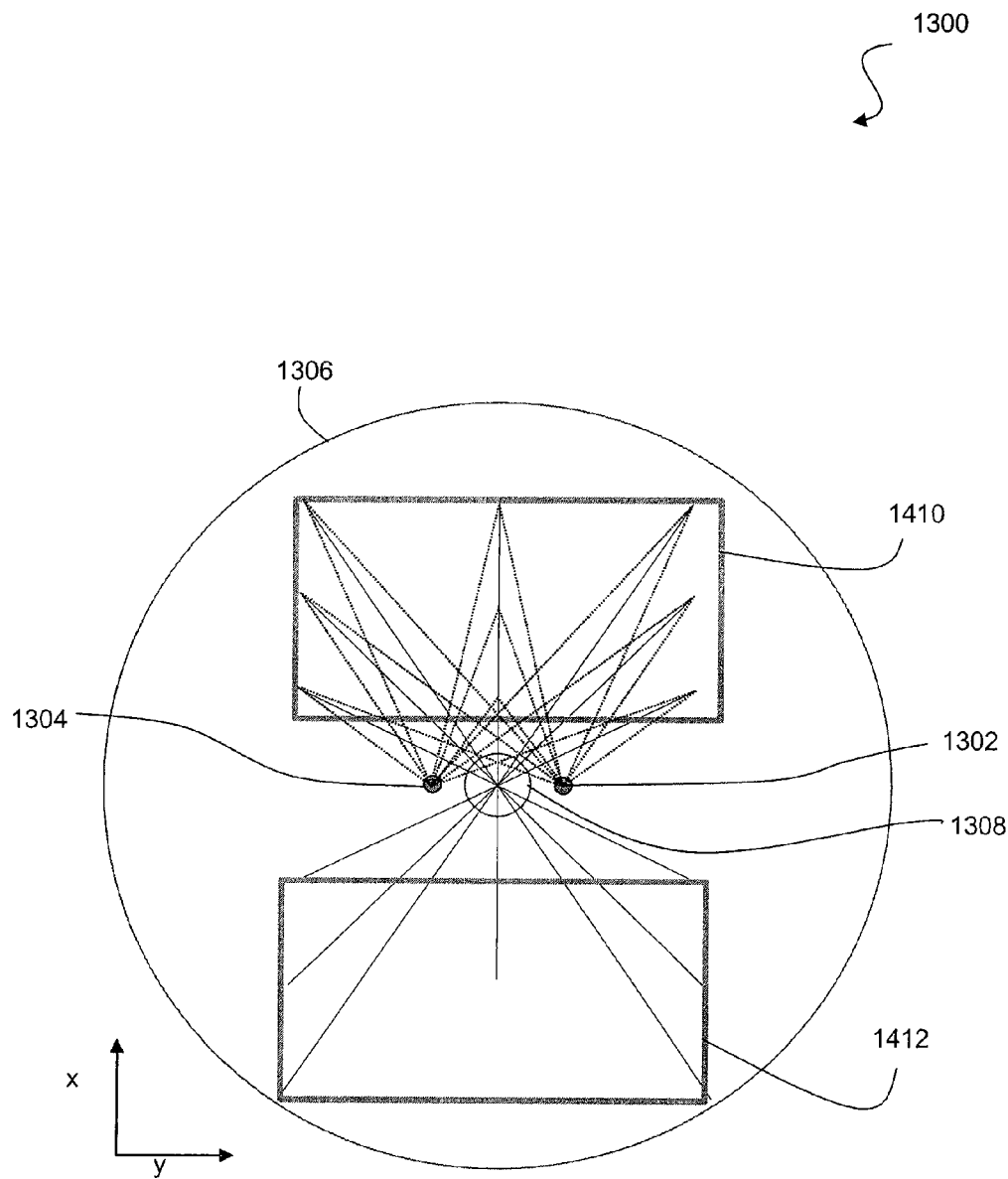
FIGS. 13 and 14 show an end and side view, respectively, of an optical system and light path in a lithography system, according to one embodiment of the present invention.
Figure 14:
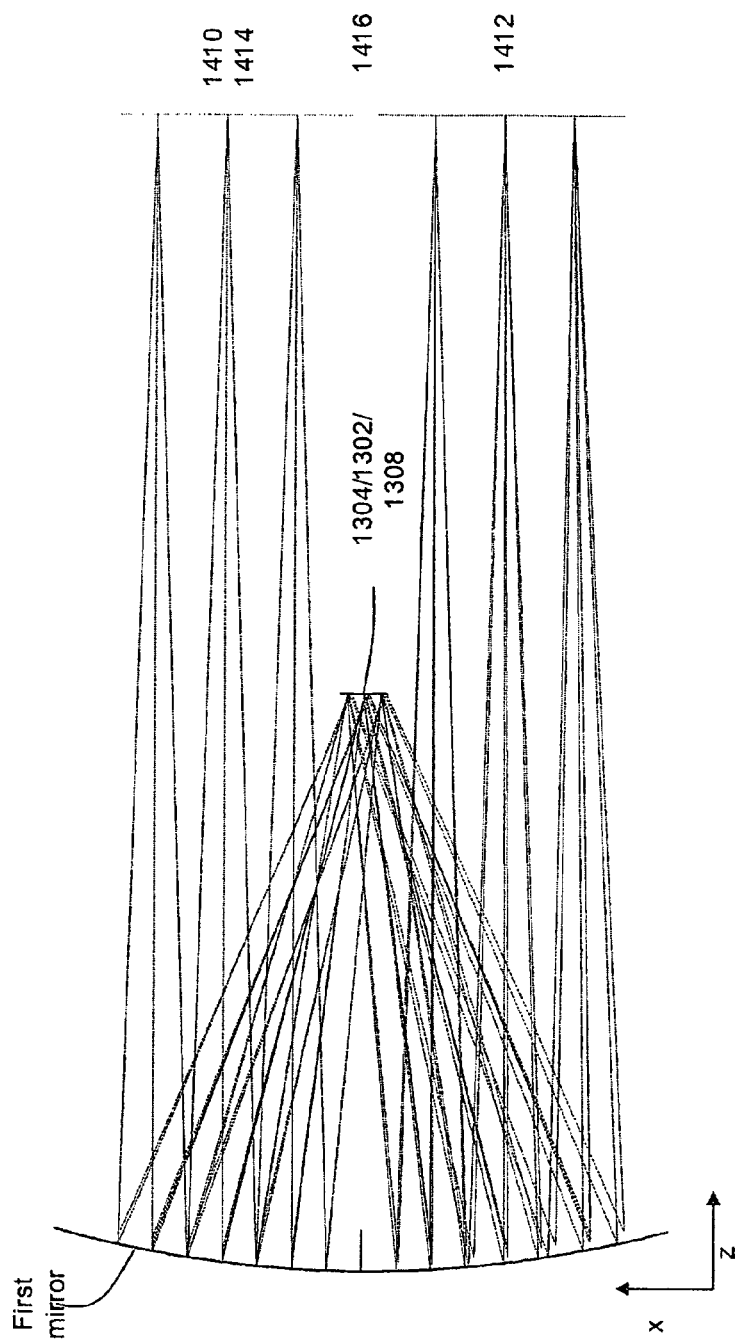

Thus, through using the blazing portion, a negative first diffraction order beam is substantially eliminated, allowing positive first diffraction order modulated beam 820 to include about twice or more than two times the intensity relative to first diffraction order modulated beam 620 in FIG. 6 because all light is concentrated in the positive first diffraction order modulated beam 820 and not split between positive and negative diffractions orders. Although zero diffraction order modulated beam 822 still receives specular reflection, it is not used within the projection part. Within projection optics, zero diffraction order modulated beam 822 is filtered out, so that only first diffraction order modulated beam 820 reaches a substrate (not shown). An example of this filtering is shown in FIGS. 13 and 14, discussed in more detail below.

With reference to FIG. 9, which is a variation to FIG. 8, an illuminating beam 916 impinges at an angle with respect to a longitudinal axis 726 of section 700. In this example, in contrast to the embodiments shown in FIGS. 6 and 8, no beam splitter would be used to direct beam 916 from an illumination source toward section 700.

In one example, the angle θ can be determined from:

$$\mathrm{Sin}(\theta) = k\lambda/p$$

Where λ is a wavelength of illumination beam 916, k equals the diffraction order which will be perpendicular to the contrast device and which will be used within the projection part and p is a pitch of the blazing grating, for example, a width and/or length of each element 702. In this embodiment, a positive k-th diffraction order modulated beam 920 is diffracted substantially perpendicular to axis 726 of section 700. The directing of positive k-th order modulated beam 920 substantially perpendicular to axis 726 of section 700 can substantially reduce the complexity of elements in a projection system compared to the number and/or complexity of elements needed to properly direct positive first order modulated beam 820 in FIG. 8 onto the substrate. The reduction of the complexity of the optics can be reduced due to the fact that the specularly reflected light in zero order diffraction modulated beam 922 is scattered outside a pupil of the projection system. This can also reduce the cost of the projection system by requiring a smaller amount of the costly material needed for the optics.

Figure 10:
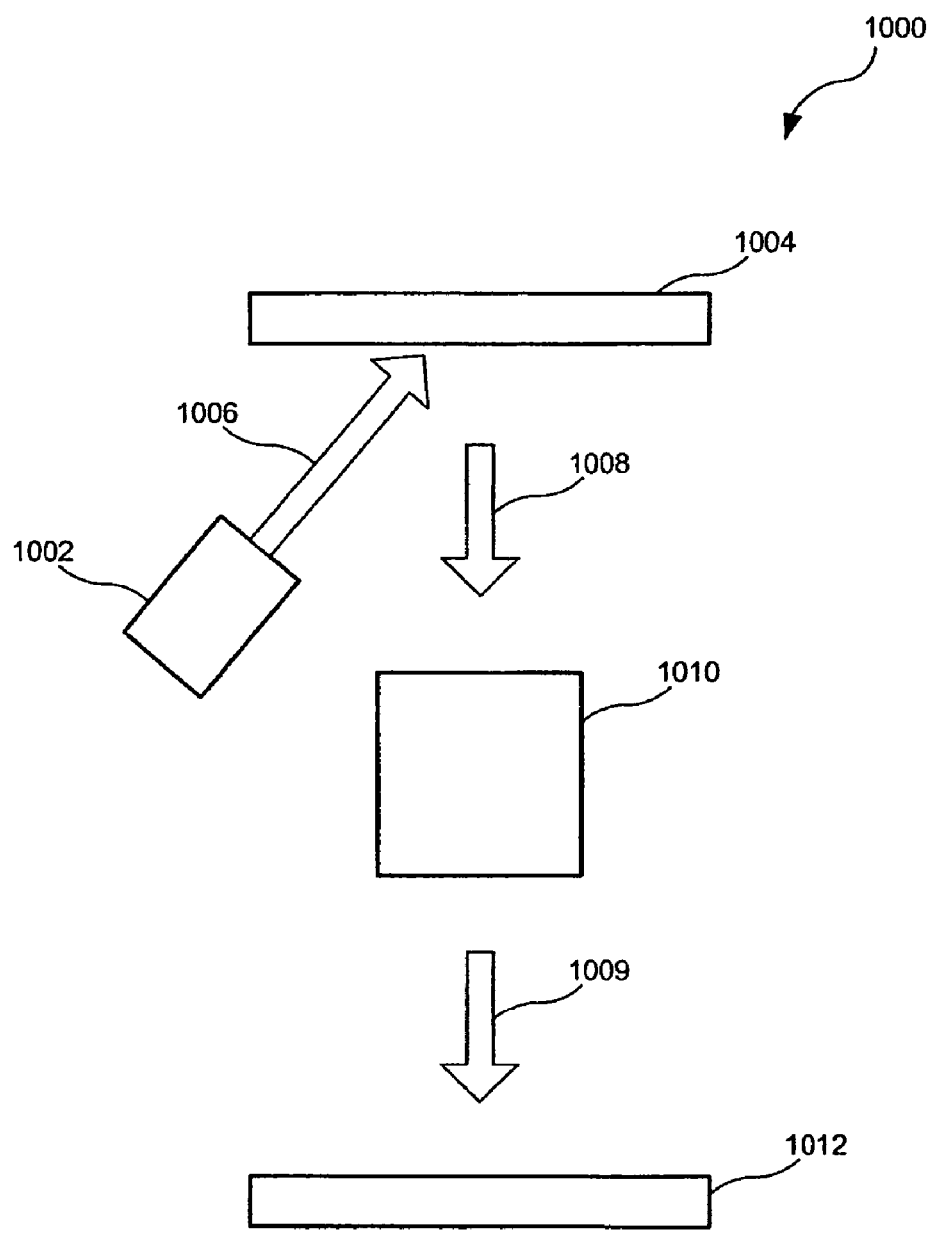
FIGS. 10 and 11 show various lithography apparatus, according to various embodiments of the present invention.
Figure 11:
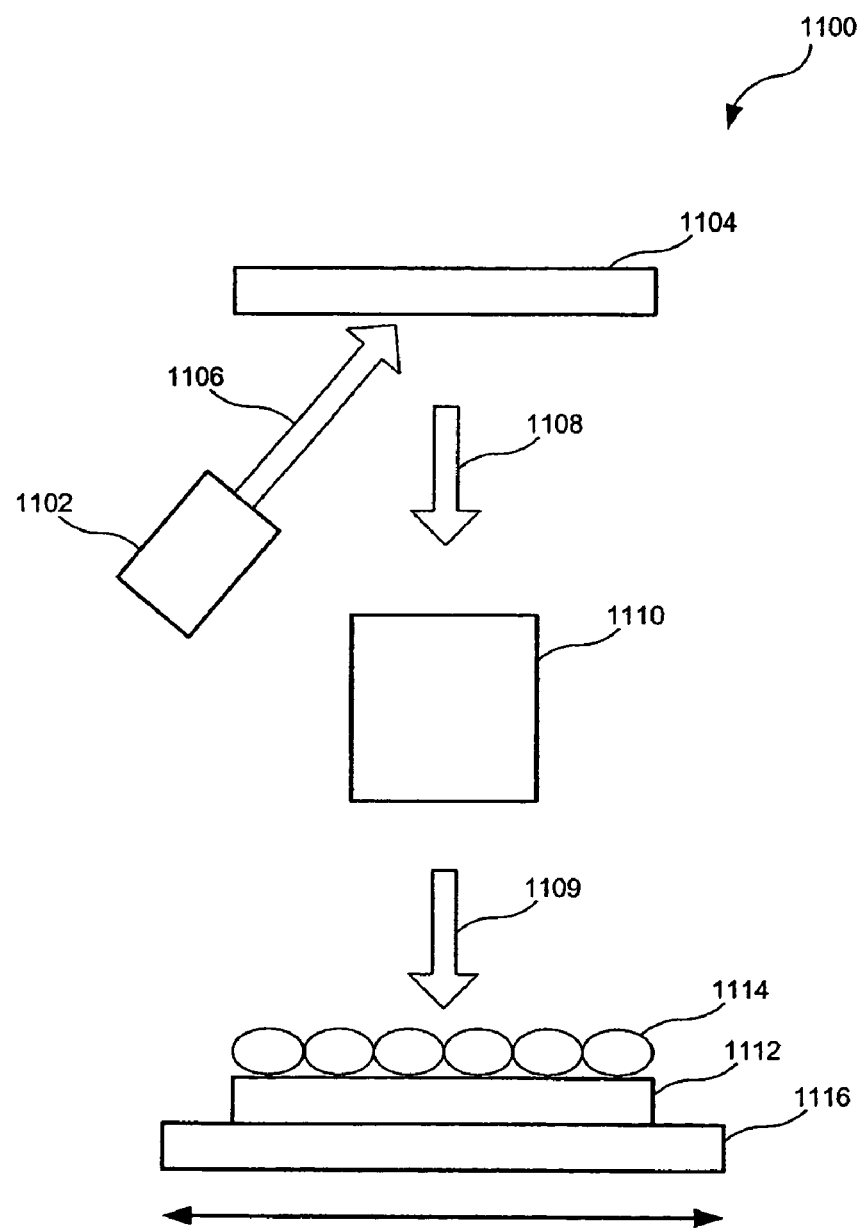

FIGS. 10 and 11 show various lithography apparatus 1000 and 1100, according to various embodiments of the present invention. For example, apparatus 1000 can be used in an integrated circuit formation environment, while apparatus 1100 can be used in a flat panel display formation environment. These systems 1000 and 1100 are similar to systems 100 and 200 in FIGS. 1A, 1B, 2A, and 2B above, respectively, except allow for direct illumination instead of using a directing device 118/218 between an illumination system, an array of individually controllable elements, and a projection system.

With reference to FIG. 10, an illumination system 1002 illuminates an array of individually controllable elements 1004 (e.g., a contrast device) with an illumination beam 1006. Although shown using direct illumination, the illuminating can be performed using a beam splitter, similar to systems shown in FIGS. 1 and 2. In various examples, illuminator 1002 can produce various illumination modes, e.g., annular, quasar, dipole, etc.

Figure 7:
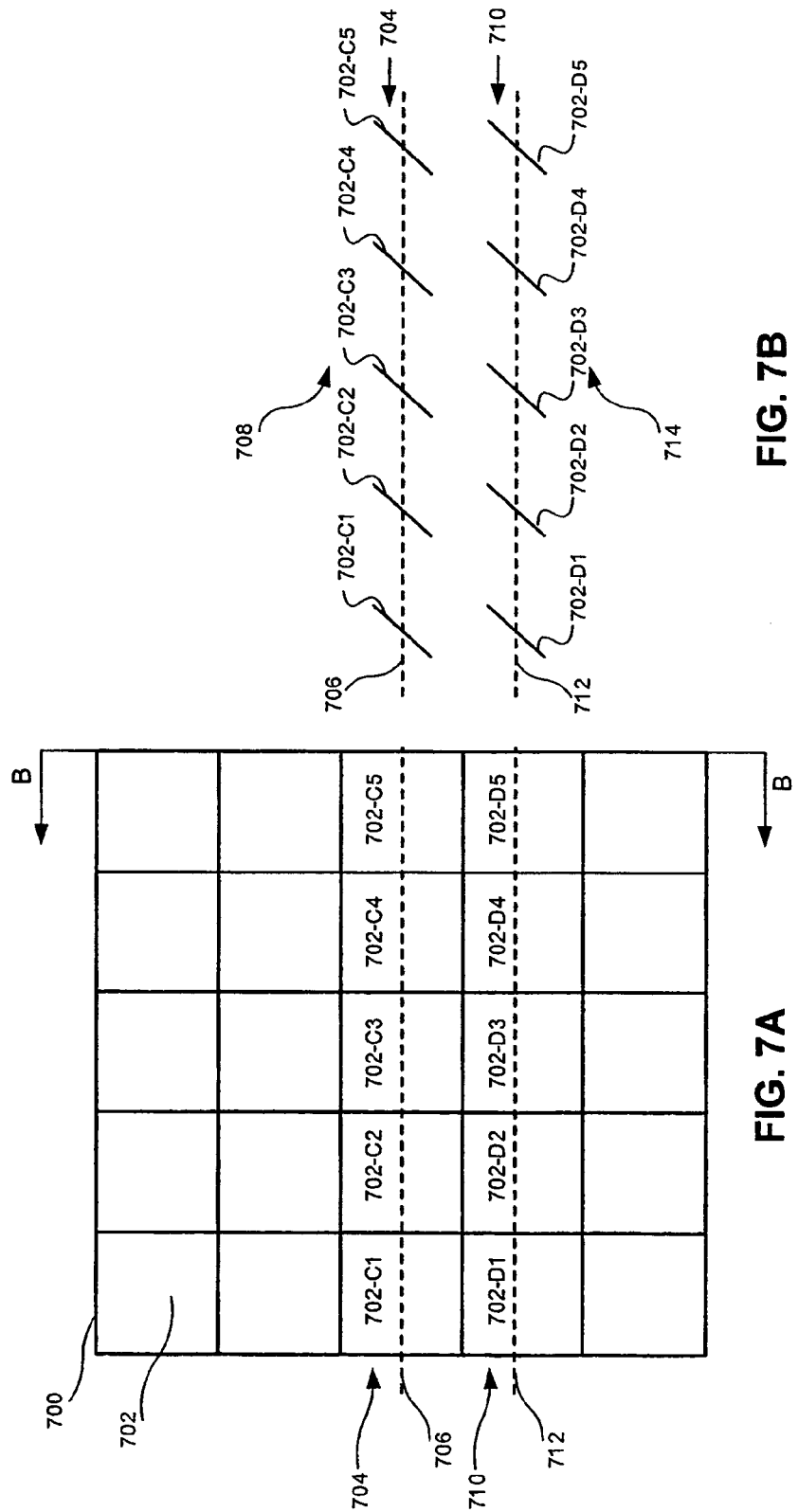
FIGS. 7A and 7B show a top and side view (looking into line B-B), respectively, of a section of an array of individually controllable elements, according to one embodiment of the present invention.

After illumination beam 1006 is diffracted using a blazing portion (not shown) of array 1004, for example as shown in embodiments in FIGS. 7-9, modulated beam 1008 is directed by projection system 1010 as projected light 1009 onto a substrate 1012. In one example, modulated beam 1008 can be demagnified by projection system 1010 to form projected light 1009. In various examples, modulated beam 1008 can include only first diffraction order modulated light or both zero and first diffraction order modulated light, as discussed above. When modulated beam 1008 includes the zero order diffraction, the diffraction order of modulated beam 1008 beam is filtered out within projection system 1010 to form projected beam 1009. Thus, only a first diffraction order portion of modulated beam 1008 is used in beam 1009 to expose substrate 1012. In this embodiment, substrate 1012 can either move or remain stationary, and in one example is a semiconductor wafer used to make integrated circuits.

With reference to FIG. 11, an illumination system 1102 illuminates an array of individually controllable elements 1104 (e.g., a contrast device or a patterning device) with an illumination beam 1106. In various examples, illuminator 1102 can produce various spot sizes at substrate level by an appropriate zoon setting or aperture truncation. After illumination beam 1106 is diffracted using a blazing portion (not shown) of array 1104, for example as shown in embodiments in FIGS. 7-9, modulated beam 1108 is directed by projection system 1110 onto a microlens array 1114 (MLA). Microlens array 1114 directs modulated beam 1108 through a projection system 1110 to produce a projection beam 1109, which is projected onto substrate 1112. Substrate 1112 is shown on substrate table 1116, which is similar to substrate table 206 of FIGS. 2A and 2B. In one example, modulated beam 1108 can be magnified by projection system 1110 to form beam 1109 and then further demagnified into diffraction limited spots on substrate 1112, similar to the spots shown in FIG. 2.

In various examples, modulated beam 1108 can include either only first diffraction order modulated light or both zero and first diffraction order modulated light, as discussed above. This can be referred to, as discussed above, pixel grid imaging. When modulated beam 1108 includes the zero order diffraction, this diffraction order of modulated beam 1108 beam is filtered out within projection system 1110 to form beam 1109. Thus, only a first diffraction order portion of modulated beam 1108 is used in beam 1109 to expose substrate 1112. In this embodiment, substrate 1112 moves or is scanned, which along with multiple exposures, forms patterns on substrate 1112. In this example, substrate 1112 is a flat panel display substrate.

Figure 12:
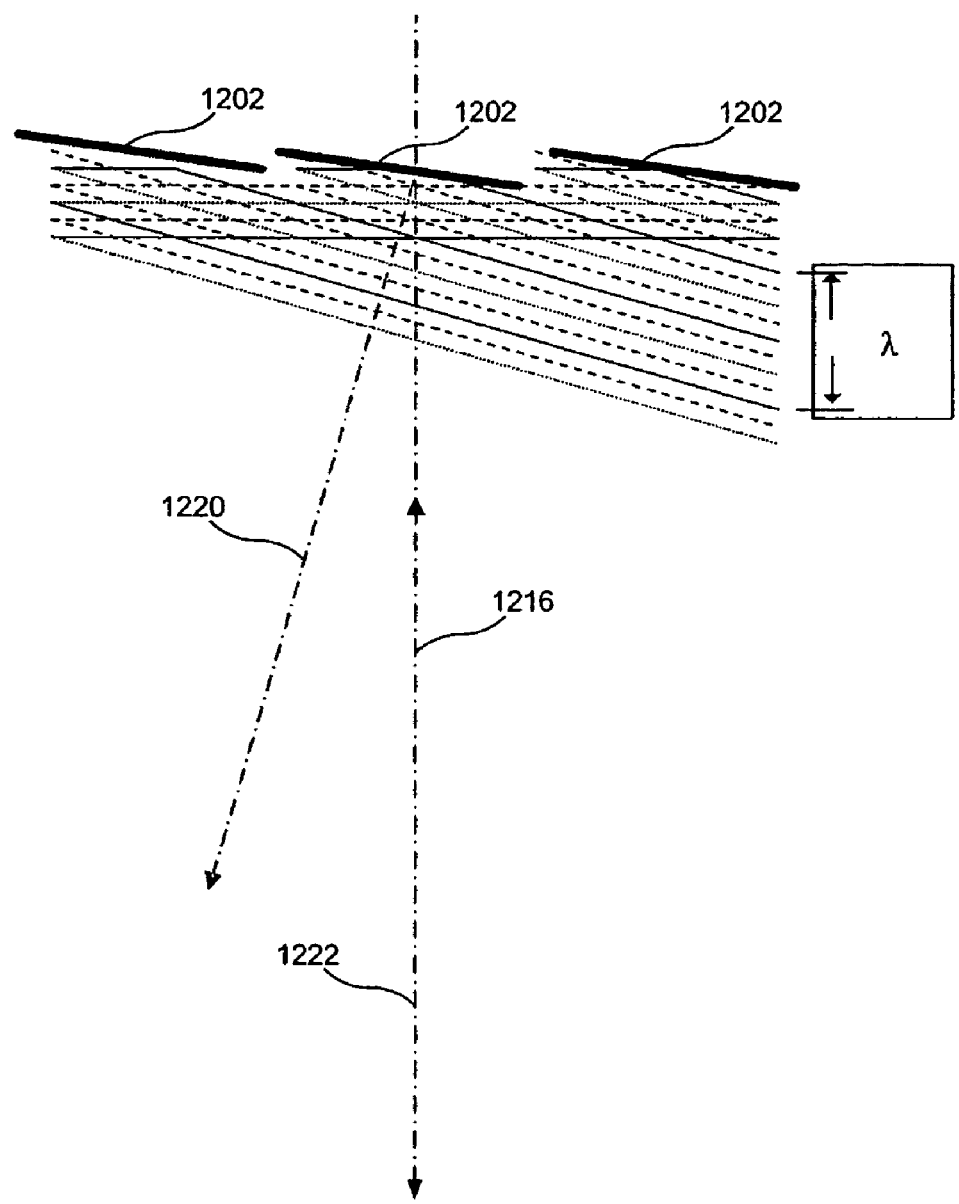
FIG. 12 shows phases of illuminating and modulated light, according to one embodiment of the present invention.

FIG. 12 shows phases of an illuminating beam 1216 and positive first diffraction order modulated beam 1220 and zero diffraction order modulated beam 1222, according to one embodiment of the present invention. For example, this embodiment shows the blazing principle obtained in the embodiments shown in FIGS. 7, 8, and 9. In the "on situation," a deflection at an end of each of individually controllable elements 1202 equals $\lambda/4$, such that the reflected wave 1220 has a wavelength difference of $\lambda/2$ with respect to nominal and a wavelength difference of $\lambda$ with respect to the next element 1202. So if all elements 1202 are at the "on" position, all light is reflected in the arcsine ($\lambda/p$) direction, i.e., there is constructive interference in only one direction so only one diffraction order is generated. Again, as discussed above, in one example the angle $\theta$ of each element 1202 can be determined from:

$$\sin(\theta) = \lambda/p$$

Where $\lambda$ is a wavelength of illumination beam 916 and p is a pitch of the blazing grating, for example, a width and/or length of each element 1202.

Similarly, this can be done for higher diffraction orders. In this case the tip deflection equals $k\lambda/4$, and the diffraction angle equals $\sin(\theta) = k\lambda/p$, where K is the diffraction order of interest.

In one example, when using pixel grid imaging, an angle $\alpha$ for each element can be between about 0 to about $\sin(\alpha) = \lambda/(2p)$, while when using partial coherence imaging the angle $\alpha$ for each element can be between about 0 to about $\sin(\alpha) = \lambda/p$. The partial coherence imaging can use higher range of tilt values to realize "negative black." Also, in an "on situation," e.g., when all light is in a first diffraction order, $\sin(\theta) = \lambda/p$. Dependent on the mirror type the deflections used can change. For instance, in case half the mirror contains a phase step, the mirror is typically used between about $\sin(\alpha) = -\lambda/(2p)$ and about $\sin(\alpha) = \lambda/(2p)$.

FIGS. 13 and 14 show an end and side view, respectively, of details of an optical system 1300 in a lithography system, according to one embodiment of the present invention. For example, this can be arranged as an Offner optical system. These figures show a placement of an illumination source 1302, a beam dump 1304, and first mirror 1306 and second mirror 1308 in order to achieve certain light paths within the lithography system, which light paths are best seen in FIG. 14. Their positioning is further specified as shown by the X, Y, and Z directional notations.

In system 1300, illumination source 1302 and beam dump 1304 are positioned on either side of second mirror 1308. Beam dump 1304 is positioned to receive zero diffraction order modulated light from an array of individually controllable devices 1410, while first diffraction order modulated light is directed, using optical system 1300, onto an image plane 1412. In this embodiment, both object plane 1414 and image plane 1412 are located along a same axis 1416. In one example, the center of curvatures of mirrors 1306 and 1308 are located between object plane 1414 and image plane 1412.

In one example, when optical system 1300 is configured as an Offner system, a numerical aperture (NA) of the Offner system can be half the diffraction angle of the blazing grating, or $\lambda/(2p)$, where p equals the pitch of the grating, e.g., a width or length of each individual controllable device in a grating direction and $\lambda$ equals the exposure wavelength.

In this example, the illumination beam is directed in a plane orthogonal to the image/object planes 1412 and 1414, respectively. For example, an illumination angle can equal the diffraction angle. Also, the illumination NA is typically smaller than (or equal to) the projection NA.

In one example, an angular distribution of light of incoming radiation from illumination device 1302 is matched with an object field at object plane 1414. For example, if an object 1410 is rectangular and angular distribution of illumination light is of the same form.

It is to be appreciated that other arrangements of optical system 1300 can be accomplished, so long as the overall light path remains substantially the same.

In various examples, the Offner can be used to that an illuminator can be combined with a projection system to realize blazing illumination. For example, the Offner can be used as a first part of a projection system, as illustrated in FIGS. 1A, 1B, 2A, 2B, 10, and 11, or it can be used as a complete projection system without additional relay in a case of unit magnification.

In one example, $\lambda/4$ tip-deflection occurs. In this case, all the light which falls in perpendicular ($\theta=0$) onto an array of individually controllable elements is reflected in the blazing angle ($\sin(\theta)=\lambda/p$), or alternatively, all the light which falls in at the blazing angle onto the array is reflected perpendicular.

In another example, zero tip-deflection can be used. In this case all the light is specular reflected (into the zero-th diffraction order) from the array according to the "law of reflection": $\theta_i=\theta_r$, the reflected angle equals the incident angle.

In various other examples, tip-deflections between 0 and $\lambda/4$ or other variation can be used to generate multiple diffraction orders. Diffraction orders appear at: $\sin(\theta)=k\lambda/p$ where, k equals the diffraction order (0, ±1, ±2, etc.). The 0 diffraction order is the specular reflected one ("law of reflection").

In other examples, at multiple times $\lambda/4$ tip deflection, i.e., when the tip deflection equals: $m\lambda/4$ (where m is a integer number, substantially all the light is concentrated in the m-th diffraction order.

In any of these above examples, a projection lens entrance pupil can be set according to numerical aperture (NA) $\leq \lambda/(2p)$, such that only one diffraction order is used within the imaging mode.

Figure 15:
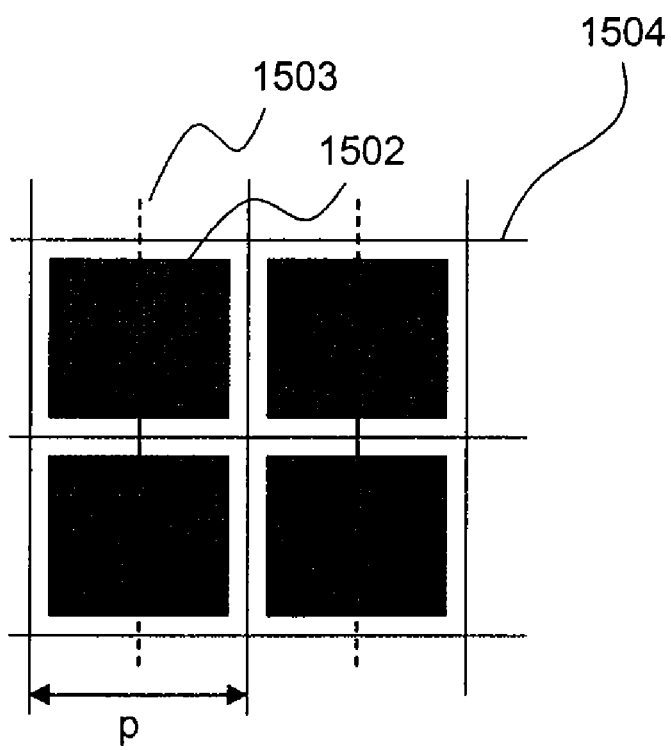
FIG. 15 shows an array of individually controllable elements, according to one embodiment of the present invention.
Figure 16:
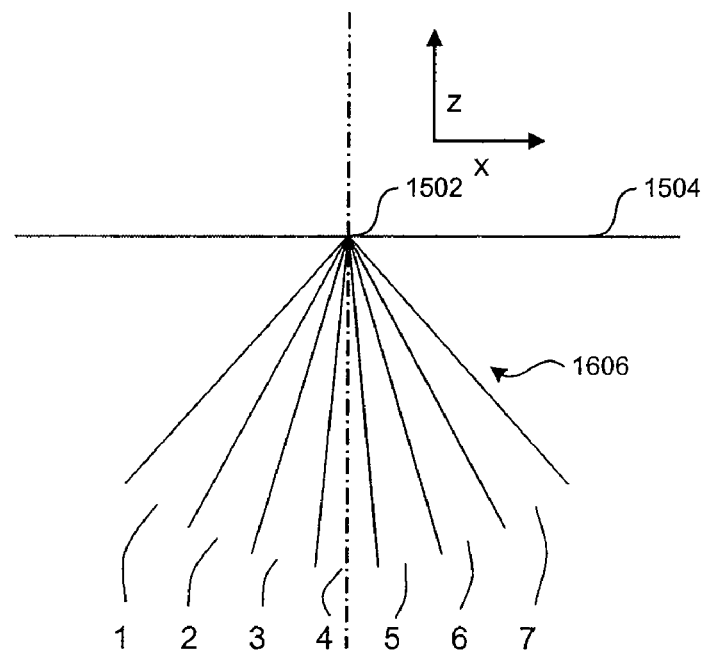
FIGS. 16 and 17 show diffraction orders of modulated light generated by the array in FIG. 15 and received at a microlens array, respectively, according to one embodiment of the present invention.
Figure 17:
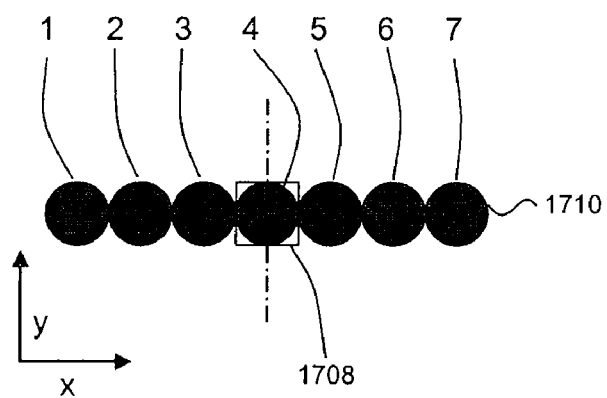

FIGS. 15, 16, and 17 are used to describe an exemplary function of an array of individually controllable elements 1504 to produce gray values, according to one embodiment of the present invention. FIG. 15 shows an array of individually controllable elements 1504, according to one embodiment of the present invention. FIGS. 16 and 17 show diffraction orders of modulated light generated by array 1504 in FIG. 15, according to one embodiment of the present invention.

In this embodiment, array 1504 comprises a rectangular grid of tilting mirrors 1502. Each mirror 1502 has its own rotation axis 1503. The rectangular grid is arranged to allow for a dense filling of the surface with mirrors 1502. Each rotation axis 1503 is parallel to one of the mirror edges. This axis 1503 can be anywhere, but typically goes through a middle of the mirror 1502. Mirrors 1502 have a same shape and a same location of their own rotation axis 1503. By actuation, each mirror 1502 can be tilted around its rotation axis 1503.

In one example, when zero tilt is defined as mirror 1502 lying in a plane which is defined by all mirrors, only positive or negative tilts are applied to mirror 1502.

As seen in FIG. 16, when light is reflected by mirror 1502, a phase of the reflected light 1606 is modulated by mirrors 1502. By selecting a specific range of angles from this reflected light 1606 and using that to re-image array 1504, the spatial distribution of phase can be translated into a spatial distribution of gray-values. This is typically done with the projection optics between the array and the substrate.

As seen in FIG. 17, in one example the angular selection is done by use of an aperture stop 1708 within a projection lens (not shown), which defines an entrance pupil. Different regions 1710-n within the projection system can receive reflected light 1606. In one example, a region pitch is defined by the diffraction orders. When region 1710-4 (e.g., perpendicular incidence) is desired to be illuminated, the undiffracted light will be reflected within the same region 1710-4. The first diffracted order will be within region 1710-3 or 1710-5 (dependent on the mirror deflection). Placing aperture stop 1708 around this region within the projection lens, the diffracted light in that region can be used.

In one example, when array 1504 allows reflected light 1606 to illuminate within region 1710-3 (e.g., blazed illumination), the undiffracted light will be reflected within region 1710-5, the first diffracted order will be within region 1710-4 (upon proper selection of the mirror rotation direction). By placing the aperture stop 1708 around this region 1710-4 within the projection lens, the diffracted light can be used, which in this case is parallel to the optical axis.

In another example, when array 1504 allows for illumination within region 1710-2 (e.g., blazed illumination within $2^{nd}$ diffraction order), the undiffracted light will be reflected within region 1710-6, the second diffracted order will be within region 1710-4 (upon proper selection of the mirror rotation direction). By placing aperture stop 1708 around this region 1710-4 within the projection lens, one can use the diffracted light, which in this case is parallel to the optical axis. With $\lambda/2$ mirror tip deflection, substantially all the light will be within the imaging aperture 1708.

In one example, projection parallel to the optical axis is desired since it makes the projection lens more easy to realize.

In one example, blazed illumination is desired since it does not require a beam splitter to illuminate a contrast device.

In one example, for $m\lambda/4$ (m=0, ±1, ±2) all the light is concentrated in a specific diffraction order (the $m^{th}$ diffraction order).

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in anyway.

What is claimed is:

1. An apparatus, comprising:
an illumination system that conditions a radiation beam;
an array of individually controllable elements that modulates the beam, at least a group of elements in the array of individually controllable elements being tilted to at least a same tilt direction with a same tilt sign; and
a projection system that projects the modulated beam onto a target portion of an object,
wherein the tilting of the group of elements at the same direction and sign forms a blazing portion, which substantially increases intensity of reflected light in a desired diffraction order of the modulated beam projected onto the object.

2. The apparatus of claim 1, further comprising:
a beam splitter positioned to direct the radiation beam onto the array of individually controllable elements and to direct the modulated beam from the array of individually controllable elements towards the projection system.

3. The apparatus of claim 1, wherein the radiation beam impinges on the array of individually controllable elements at a blazing angle.

4. The apparatus of claim 3, wherein:
a desired diffraction order of the modulated beam is directed through a pupil of the projection system; and
the undesired orders of the modulated beam are scattered outside of the pupil of the projection system.

5. The apparatus of claim 3, wherein the blazing angle is defined as sin ($\theta$) =k $\lambda$/p, wherein $\theta$ is the predetermined angle, $\lambda$ is a wavelength of the radiation beam, k equals the diffraction order which will be perpendicular to the array of individually controllable elements and which will be used within the projection system, and p is one of a width or length of each of the individually controllable elements.

6. The apparatus of claim 1, further comprising:
a microlens array positioned between the projection system and the object, wherein the microlens array is used to perform pixel grid imaging of the object.

7. The apparatus of claim 1, wherein:
the array of individually controllable elements comprises one or more super-pixel sections; and
each of the super-pixel sections tilts its associated individually controllable elements at a same or different one of the tilt direction and the tilt sign with respect to other ones of the super-pixel sections.

8. The apparatus of claim 1, wherein:
a positive first diffraction order of the modulated beam reflecting from the array of individually controllable elements is directed towards the projection system;
a negative first diffraction order is substantially eliminated by the array of individually controllable elements; and
a zero diffraction order of the modulated beam reflecting from the array of individually controllable elements is directed towards a beam dump.

9. The apparatus of claim 1, further comprising:
an optical system including a first mirror and a second mirror,
wherein the radiation beam is reflected from the first mirror onto the array of individually controllable elements; and
wherein the modulated beam is reflected off the first mirror, then the second mirror, and back off the first mirror before impinging on the projection system.

10. The apparatus of claim 9, wherein:
a positive first diffraction order of the modulated beam reflecting from the array of individually controllable elements is directed towards the projection system;
a negative first diffraction order is substantially eliminated by the array of individually controllable elements; and
a zero diffraction order of the modulated beam reflecting from the array of individually controllable elements is directed towards a beam dump.

11. The apparatus of claim 10, wherein:
the illumination system is positioned on a first side of the second mirror; and
the beam dump is positioned on a second side of the second mirror.

12. The apparatus of claim 9, wherein the object and the array of individually controllable elements lie along a same plane.

13. The apparatus of claim 1, wherein the object is one of a substrate, a work piece, or a display device.

14. The apparatus of claim 1, wherein the projection system includes an aperture that filters out undesired diffraction orders of the modulated beam.

15. A device manufacturing method comprising:
(a) tilting at least one group of elements in the array of individually controllable elements to at least a same tilt direction with a same tilt sign;
(b) modulating a beam of radiation using the array of individually controllable elements; and
(c) projecting the modulated beam onto a target portion of an object,
wherein the tilting of the group of elements at the same direction and sign forms a blazing portion, which substantially increases intensity of reflected light in a desired diffraction order of the modulated beam projected onto the object.

16. The method of claim 15, wherein step (d) comprises:
directing a desired diffraction order of the modulated beam through a pupil of a projection system; and
scattering the undesired orders of the modulated beam outside of the pupil of the projection system.

17. The method of claim 15, further comprising:
positioning a microlens array adjacent the object to perform pixel grid imaging of the object.

18. The device manufacturing method of claim 15, further comprising:
(d) filtering out undesired diffraction orders of the modulated beam before they reach the object.

19. A method of forming a flat panel display comprising:
(a) tilting at least one group of elements in the array of individually controllable elements to at least a same tilt direction with a same tilt sign;
(b) modulating a beam of radiation using the array of individually controllable elements; and
(c) projecting the modulated beam onto a target portion of an object,
wherein the tilting of the group of elements at the same direction and sign forms a blazing portion, which substantially increases intensity of reflected light in a desired diffraction order of the modulated beam projected onto the object.

20. The method of claim 19, further comprising:
(d) filtering out undesired diffraction orders of the modulated beam before they reach the object.

21. A method of forming an integrated circuit device comprising:

(a) tilting at least one group of elements in the array of individually controllable elements to at least a same tilt direction with a same tilt sign;
(b) modulating a beam of radiation using the array of individually controllable elements; and
(c) projecting the modulated beam onto a target portion of an object,
wherein the tilting of the group of elements at the same direction and sign forms a blazing portion, which substantially increases intensity of reflected light in a desired diffraction order of the modulated beam projected onto the object.

22. The method of claim 21, further comprising:
(d) filtering out undesired diffraction orders of the modulated beam before they reach the object.

* * * * *